(12) United States Patent
Valtysson

(10) Patent No.: US 11,336,198 B2
(45) Date of Patent: May 17, 2022

(54) SYSTEM FOR GENERATING A POWER OUTPUT AND CORRESPONDING USE

(71) Applicant: LAKI POWER EHF., Reykjavik (IS)

(72) Inventor: Oskar H. Valtysson, Kopavogur (IS)

(73) Assignee: LAKI POWER EHF., Reykjavik (IS)

( * ) Notice: Subject to any disclaimer, the term of this patent is extended or adjusted under 35 U.S.C. 154(b) by 0 days.

(21) Appl. No.: 16/638,319

(22) PCT Filed: Aug. 10, 2018

(86) PCT No.: PCT/IS2018/050007
§ 371 (c)(1),
(2) Date: Feb. 11, 2020

(87) PCT Pub. No.: WO2019/030781
PCT Pub. Date: Feb. 14, 2019

(65) Prior Publication Data
US 2020/0373850 A1   Nov. 26, 2020

(30) Foreign Application Priority Data

Aug. 11, 2017   (IS) .......................................... 050185

(51) Int. Cl.
*H02M 7/217*   (2006.01)
*H02M 1/00*   (2006.01)
*G01R 15/18*   (2006.01)

(52) U.S. Cl.
CPC ............. *H02M 7/217* (2013.01); *H02M 1/00* (2013.01); *G01R 15/183* (2013.01); *H02M 1/0009* (2021.05)

(58) Field of Classification Search
CPC ........... H02M 1/00; H01H 1/00; H01H 69/00; H02H 1/00
See application file for complete search history.

(56) References Cited

U.S. PATENT DOCUMENTS

| | | | |
|---|---|---|---|
| 8,896,315 B1 * | 11/2014 | Davies ................. | H02J 7/0019 324/434 |
| 9,112,422 B1 * | 8/2015 | Vinciarelli ........ | H02M 3/33576 |

(Continued)

FOREIGN PATENT DOCUMENTS

| | | |
|---|---|---|
| GB | 522276 A | 6/1940 |
| WO | 2015078173 A1 | 6/2015 |
| WO | 2017138026 A1 | 8/2017 |

OTHER PUBLICATIONS

International Search Report and Written Opinion dated Oct. 19, 2018 for corresponding International Application No. PCT/IS2018/050007.

(Continued)

*Primary Examiner* — Jermele M Hollington
*Assistant Examiner* — Temilade S Rhodes-Vivour
(74) *Attorney, Agent, or Firm* — Tarolli, Sundheim, Covell & Tummino LLP

(57) ABSTRACT

The present invention relates to a system for generating a direct current power output from an alternating current (103) in a primary wire (3), wherein the system comprises: at least one core (104) configured to be located around the primary wire (3); at least one secondary winding (22, 24) arranged around the at least one core (104), wherein each winding (22, 24), together with the at least one core (104) and the primary wire (3), forms a current transformer unit, and wherein each secondary winding (22, 24) has a first end and a second end; for each secondary winding (22, 24), a rectifier (10), wherein each rectifier (10) is configured to convert an alternating current to a direct current, and wherein each rectifier (10) comprises two AC connections for alternating current and two DC connections for direct current, wherein the first end and the second end of the secondary winding (22, 24) are connected to the AC connections of the rectifier (10); for each secondary winding (22, 24), a shunting unit (Continued)

arranged and configured to short the ends of the secondary winding (22, 24); and a load element (6), wherein the load element (6) is connected to a DC connection of each rectifier (10). The present invention also relates to a corresponding use.

19 Claims, 8 Drawing Sheets

(56) References Cited

U.S. PATENT DOCUMENTS

| | | | |
|---|---|---|---|
| 9,188,610 B1 | 11/2015 | Edel | |
| 2003/0052658 A1* | 3/2003 | Baretich | H02M 5/293 323/284 |
| 2007/0109827 A1* | 5/2007 | DelaCruz | H02M 5/08 363/131 |
| 2012/0176120 A1 | 7/2012 | Jefferies | |
| 2012/0236611 A1* | 9/2012 | Alexandrov | H02M 7/155 363/126 |
| 2012/0306473 A1 | 12/2012 | Chen | |
| 2013/0155727 A1* | 6/2013 | Karlsson | H02M 3/33592 363/21.04 |
| 2014/0160820 A1 | 6/2014 | McKinley | |
| 2014/0306551 A1 | 10/2014 | Jost | |
| 2015/0137596 A1 | 5/2015 | Steiner-Jovic | |

OTHER PUBLICATIONS

Danish Search Report dated Dec. 4, 2017 for corresponding IS Patent Application No. 050185.

* cited by examiner

SYSTEM FOR GENERATING A POWER OUTPUT AND CORRESPONDING USE

The invention lies in the field of electrical power harvesting. More specifically, the invention relates to a system and use for extracting power from electrical conductors.

Energy distribution is a key part of today's infrastructure. Electrical energy is often transferred via power lines. These are typically power lines carrying alternating current under a high voltage. Since power lines generally stretch along large distances, it can be important to survey their operation remotely. This can allow operators to detect any potential malfunctions and run diagnostics, fix the problems remotely and/or localize them precisely before setting out for repairs.

Power lines surveying and diagnostics can be advantageously performed via devices extracting power directly from the power lines. This allows such devices to avoid having an inbuilt power source, like batteries and such, and provides an efficient way of monitoring the lines.

Some such devices are known in the art. For example, U.S. Pat. No. 4,746,241 discloses modules that are mounted on power conductors on both sides of power transformers in electrical substations and on power conductors along electrical transmission lines. The modules are capable of measuring current, voltage, frequency, and power factor.

Further, US patent application 2004/0183522 A1 discloses an apparatus for sensing the current in a power line of a power system and systems incorporating the apparatus.

Similarly, US patent application 2010/0084920 A1 discloses a current transforming harvester, which is capable of producing power from a conductor on a preexisting power grid.

However, while the prior art may be satisfactory for some applications, it has certain drawbacks and limitations. For example, the power that is generated for additional equipment may not be sufficiently large, and/or may not be controlled in a suitable manner. Furthermore, the service life of the discussed devices may be far from optimal.

In light of the above, it is an object of the present invention to overcome or at least alleviate the shortcomings and disadvantages of the prior art. That is, it is an object of the present invention to provide a system and use for power generation based on the current in a wire, which system and use are improved with regard to power generation, control of power generation, and service life. These objects are met by the present invention.

In a first aspect, the present invention relates to a system for generating a direct current (DC) power output from an alternating current (AC) in a primary wire. The system comprises at least one core configured to be located around the primary wire and at least one secondary winding arranged around the at least one core, wherein each winding, together with the at least one core and the primary wire, forms a current transformer unit, and wherein each secondary winding has a first end and a second end. The system further comprises, for each secondary winding, a rectifier, wherein each rectifier is configured to convert an alternating current to a direct current, and wherein each rectifier comprises two AC connections for alternating current and two DC connections for direct current, wherein the first end and the second end of the secondary winding are connected to the AC connections of the rectifier. The system further comprises, for each secondary winding, a shunting unit arranged and configured to short the ends of the secondary winding. Further still, the system may comprise a load element, wherein the load element is connected to a DC connection of each rectifier. In other words, the load element is connected to a DC connection side of each rectifier.

Such a system may meet the above discussed objects. In simple words, the discussed system provides one or a plurality of secondary windings that can convert the alternating current (AC) in a primary wire (such as the wire of a power line) to a secondary winding alternating current. Each such secondary winding may thus provide a secondary winding alternating current. Each such secondary winding alternating current (AC) can be transformed to a direct current (DC) by the respective rectifier. By connecting all the rectifiers together on their DC side, the generated direct current and their respective DC voltage can be added together. When a load or a burden is present on the DC side, this may be used to generate DC voltage and thus a DC power output.

Thus, a suitable powering system is provided, which may be used for powering, e.g., surveillance equipment. In particular, the present technology allows to generate power which is sufficiently large.

Furthermore, it will be understood that each shunting unit allows a particular secondary winding to be shunted, i.e., its end to be shorted. Thus, such a secondary winding that has been shunted will not contribute to the power generation. This allows for a suitable (and, in embodiments also: automated) control of the power output, which may also increase the efficiency and service life of the system and further equipment's connected thereto.

In other words, the invention utilizes one or a plurality of current transformers clamped onto the same phase wire for the purpose of maximizing electric energy harvesting from the electromagnetic field surrounding the phase wire. Furthermore, the invention may regulate and control "high power" energy harvesting independent of the balance between the available phase wire current and the output power demand. Further still, the invention may dynamically include and/or exclude current transformers or individual secondary windings from the electric energy harvesting circuitry (by means of the shunting units).

The at least one secondary winding may be a plurality of secondary windings.

The DC connections of the rectifiers that are connected to the load element may be connected in parallel.

Thus, the electric energy harvesting output from plurality of current transformers may be summed without the current transformers affecting the electrical characteristics of each other.

The system may be configured to generate at least 30 watts of power, preferably at least 50 watts, such as at least 60 watts.

That is, the discussed system may be able generate more than 60 watts of stable DC power from an electromagnetic field surrounding a phase wire The core may be a transformer core configured to induce current in the secondary windings.

Each rectifier may be a rectification bridge.

For each secondary winding, the secondary winding and the shunting element may be located on a first side of the rectifier, and the load element may be located on a second side of the rectifier, the second side being opposite to the first side.

It should be understood that "being located" on one side of the rectifier (e.g., rectification bridge) denotes the location in an electrical circuit. That is, when two components are said to be located on one side of a unit (e.g., the rectification bridge), this denotes that current may flow between these two components without having to pass the rectification bridge. If one element is said to be located on the opposite side of a unit with respect to another element, no current can flow between these elements without passing through the unit. It will be understood that the first side may also be referred to as the alternating current (AC) side, and the second side may also be referred to as the direct current (DC) side.

The secondary windings may not be directly connected to each other on the first side.

Each rectifier may comprise a plurality of MOSFETs, such as at least 4 MOSFETs, e.g., 4 MOSFETs.

It will be understood that MOSFET denotes a metal-oxide-semiconductor field-effect transistor. Using such MOSFETs, instead of, e.g., diodes may be advantageous. Such MOSFETs may impose very low electronic path resistance instead of the large silicon voltage drop that conventional diodes do, thereby leading to a "cold rectification". That is, heat generation may be reduced (potentially leading to a longer service life) and less energy losses in the electronic circuitry. That is, the present system may regulate and control "high power" energy harvesting without imposing high power losses and high heat generation in the power regulation circuitry. Put differently still, the system may be a "cold" rectification circuitry based on MOSFETs in the rectification bridges instead of diodes, therefore reducing or eliminating power losses and the associated heat generation.

The at least one MOSFET may be configured to have a resistance of less than 50 mΩ, preferably less than 10 mΩ, further preferably less than 4 mΩ.

Each shunting unit may comprise at least two MOSFETs. In particular, the system may comprise optically controlled MOSFET transistor pair as a AC and DC current shunt for each of the current transformers and/or each individual secondary winding. Using MOSFETs also for the shunting component may have advantages corresponding to the ones discussed above in conjunction with the MOSFETs used for the rectifier.

The shunting unit may have a resistance of less than 50 mΩ, preferably less than 15 mΩ, further preferably less than 10 mΩ.

The system may further comprise a current sensing element for sensing a current.

The current sensing element may be connected in series to a secondary winding.

The current sensing element may be located on the first side of the rectifier.

The current sensing element may be galvanically isolated.

The current sensing element may have a resistance of less than 5 mΩ, preferably less than 1 mΩ, further preferably less than 0.7 mΩ. Again, having a low resistance may reduce power losses and heat generation, thereby leading to a lower power consumption and to an increased efficiency and service life.

The system may further comprise, for each shunting unit, a shunt controller unit for controlling the state of the respective shunting unit.

Each shunt controller unit may comprise at least one optically isolated MOSFET driver.

Each shunt controller unit may comprise a voltage level state input and may be configured to control the state of the respective shunt unit in dependence of the voltage level state input.

Each voltage level state input may be based on a voltage across the load element.

Each shunt controller unit may comprise a clock input, and each controller unit may be configured to only change a state of the respective shunt unit in dependence of the clock input.

Each shunt controller unit may comprise a D-type flip flop latch.

Each shunt controller unit may be configured to only change the state of the respective shunt unit in dependence of a sensed current.

The sensed current may be an alternating current and each controller unit may be configured to only change the state of the respective shunt unit at zero crossing states of the alternating current.

Only changing the state of the respective shunt unit (i.e., from shorted to un-shorted or vice versa) may be advantageous, as thus, voltage spikes are avoided, which could harm the circuitry. Only switching at zero crossing states may therefore improve the operation and the service life of the system.

The system may further comprise a zero crossing detection element for detecting zero crossing states of the sensed current.

In particular, the system may use synchronous zero-crossing MOSFET shunting circuitry.

The zero crossing detection element may comprise a Hall effect current sensor.

The system may further comprise a system control unit, wherein the system control unit is configured to generate the voltage level state inputs (logic state high or low) for each shunt controller unit based on the voltage across the load element.

The system control unit may be configured such that: the higher the voltage across the load element, the more voltage level state inputs instructing the respective shunt controller units to short the respective shunting units are generated by the system control unit.

This may be a suitable automated control.

The system control unit may be configured to instruct a shunt controller unit to activate and deactivate a shunting unit in a pulsed manner.

The system may be configured for a primary wire carrying at least 100 Ampere, preferably at least 300 Ampere, further preferably at least 1,500 Ampere.

The system may comprise at least 1 secondary winding, preferably at least 5, such as 6.

The at least one core may be a plurality of cores, the number of the cores may equal the number of secondary windings, and each secondary winding may be arranged around a distinct core.

Alternatively, at least two secondary windings may be arranged around the same core.

The present invention also relates to a use of the system as described above.

The primary wire may be a high-voltage power line and at least one of the cores may be located around the primary wire.

The primary wire may conduct a current of at least 100 Ampere, preferably at least 300 Ampere, more preferably at least 1,500 Ampere.

The use may comprise generating a power output, which is used by surveillance equipment for the high-voltage power line.

The use may comprise the controller units changing the state of their respective shunt units only at zero crossing states of the alternating current.

For a first secondary winding, the respective shunting unit may short the ends of said first secondary winding, when a voltage across the load element exceeds a first threshold.

For a second secondary winding, the respective shunting unit may short the ends of said second secondary winding, when a voltage across the load element exceeds a second threshold.

For a further secondary winding, the respective shunting unit may periodically short the ends of said further secondary winding, when a voltage across the load element exceeds a further threshold.

The discussed system may be configured for the use as discussed above.

The present invention is also defined by the following numbered embodiments.

Below is a list of system embodiments. Those will be indicated with a letter "S". Whenever such embodiments are referred to, this will be done by referring to "S" embodiments. And whenever reference is herein made to system embodiments, the embodiments denoted by an "S" are meant.

S1. A system for generating a direct current power output from an alternating current (103) in a primary wire (3), wherein the system comprises:
- at least one core (104) configured to be located around the primary wire (3);
- at least one secondary winding (22, 24) arranged around the at least one core (104), wherein each secondary winding (22, 24), together with the at least one core (104) and the primary wire (3), forms a current transformer unit, and wherein each secondary winding (22, 24) has a first end and a second end;
- for each secondary winding (22, 24), a rectifier (10), wherein each rectifier (10) is configured to convert an alternating current to a direct current, and wherein each rectifier (10) comprises two AC connections for alternating current and two DC connections for direct current, wherein the first end and the second end of the secondary winding (22, 24) are connected to the AC connections of the rectifier (10);
- for each secondary winding (22, 24), a shunting unit arranged and configured to short the ends of the secondary winding (22, 24); and
- a load element (6), wherein the load element (6) is connected to a DC connection of each rectifier (10).

S2. The system according to the preceding embodiment, wherein the at least one secondary winding (22, 24) is a plurality of secondary windings (22, 24).

S3. The system according to the preceding embodiment, wherein the DC connections of the rectifiers (10) that are connected to the load element (6) are connected in parallel.

S4. The system according to any of the preceding embodiments, wherein the system is configured to generate at least 30 watts of power, preferably at least 50 watts, such as at least 60 watts.

S5. The system according to any of the preceding embodiments, wherein the core (104) is a transformer core configured to induce current in the secondary windings (22, 24).

S6. The system according to any of the preceding embodiments, wherein each rectifier (10) is a rectification bridge.

S7. The system according to any of the preceding embodiments, wherein for each secondary winding (22, 24),
the secondary winding (22, 24) and the shunting element are located on a first side of the rectifier (10), and the load element (6) is located on a second side of the rectifier (10), the second side being opposite to the first side.

It should be understood that "being located" on one side of the rectifier (e.g., the rectification bridge) denotes the location in an electrical circuit. That is, when two components are said to be located on one side of a unit (e.g., the rectification bridge), this denotes that current may flow between these two components without having to pass the rectification bridge. If one element is said to be located on the opposite side of a unit with respect to another element, no current can flow between these elements without passing through the unit. It will be understood that the first side may also be referred to as the alternating current (AC) side, and the second side may also be referred to as the direct current (DC) side.

S8. The system according to the preceding embodiment and with the features of embodiments S2, wherein the secondary windings (22, 24) are not directly connected to each other on the first side.

S9. The system according to any of the preceding embodiments, wherein each rectifier (10) comprises a plurality of MOSFETs, such as at least 4 MOSFETs.

It will be understood that MOSFET denotes a metal-oxide-semiconductor field-effect transistor.

S10. The system according to any the preceding embodiment, wherein the MOSFETs are configured to have a resistance of less than 50 mΩ, preferably less than 10 mΩ, further preferably less than 4 mΩ.

S11. The system according to any of the preceding embodiments, wherein each shunting unit comprises at least two MOSFETs.

S12. The system according to any of the preceding embodiments, wherein the shunting unit has a resistance of less than 50 mΩ, preferably less than 15 mΩ, further preferably less than 10 mΩ.

S13. The system according to any of the preceding embodiments, wherein the system further comprises a current sensing element for sensing a current.

S14. The system according to the preceding embodiment, wherein the current sensing element is connected in series to a secondary winding (22, 24).

S15. The system according to the preceding embodiment and with the features of embodiment S7, wherein the current sensing element is located on the first side of the rectifier (10).

S16. The system according to any of the three preceding embodiments, wherein the current sensing element is galvanically isolated.

S17. The system according to any of the four preceding embodiments, wherein the current sensing element has a resistance of less than 5 mΩ, preferably less than 1 mΩ, further preferably less than 0.7 mΩ.

S18. The system according to any of the preceding embodiments, wherein the system further comprises, for each shunting unit, a shunt controller unit for controlling the state of the respective shunting unit.

S19. The system according to the preceding embodiment, wherein each shunt controller unit comprises at least one optically isolated MOSFET driver.

S20. The system according to any of the 2 preceding embodiments wherein each shunt controller unit comprises a voltage level state input and is configured to control the state of the respective shunt unit in dependence of the voltage level state input.

S21. The system according to the preceding embodiment, wherein each voltage level state input is based on a voltage across the load element (6).

S22. The system according to any of the 4 preceding embodiments, wherein each shunt controller unit comprises a clock input, and wherein each controller unit is configured to only change a state of the respective shunt unit in dependence of the clock input.

S23. The system according to any of the 5 preceding embodiments, wherein each shunt controller unit comprises a D-type flip flop latch.

S24. The system according to any of the 6 preceding embodiments and with the features of embodiment S13, wherein each shunt controller unit is configured to only change the state of the respective shunt unit in dependence of a sensed current.

S25. The system according to the preceding embodiment, wherein the sensed current is an alternating current and wherein each controller unit is configured to only change the state of the respective shunt unit at zero crossing states of the alternating current.

S26. The system according to the preceding embodiment, wherein the system further comprises a zero crossing detection element for detecting zero crossing states of the sensed current.

S27. The system according to the preceding embodiment, wherein the zero crossing detection element comprises a Hall effect current sensor.

S28. The system according to any of the preceding embodiments and with the features of embodiment S20, wherein the system further comprises a system control unit, wherein the system control unit is configured to generate the voltage level state inputs for each shunt controller unit based on the voltage across the load element (6).

S29. The system according to the preceding embodiment and with the features of embodiment S2, wherein the system control unit is configured such that: the higher the voltage across the load element (6), the more voltage level state inputs instructing the respective shunt controller units to short the respective shunting units are generated by the system control unit.

S30. The system according to the any of the two preceding embodiments, wherein the system control unit is configured to instruct a shunt controller unit to activate and deactivate a shunting unit in a pulsed manner.

S31. The system according to any of the preceding embodiments, wherein the system is configured for a primary wire (3) carrying at least 100 Ampere, preferably at least 300 Ampere, further preferably at least 1,500 Ampere.

S32. The system according to any of the preceding embodiments, wherein the system comprises at least 3 secondary windings (22, 24), preferably at least 5, such as 6.

S33. The system according to any of the preceding embodiments and with the features of embodiment S2, wherein
the at least one core (104) is a plurality of cores (104),
the number of the cores (104) equals the number of secondary windings (22, 24), and
each secondary winding (22, 24) is arranged around a distinct core (104).

S34. The system according to any of the embodiments S1 to S32 and with the features of embodiment S2, wherein
at least two secondary windings (22, 24) are arranged around the same core (104).

Below is a list of use embodiments. Those will be indicated with a letter "U". Whenever such embodiments are referred to, this will be done by referring to "U" embodiments. And whenever reference is herein made to use embodiments, the embodiments denoted by a "U" are meant.

U1. Use of the system according to any of the preceding embodiments.

U2. Use according to the preceding embodiment with the primary wire (3), wherein the primary wire (3) is a high-voltage power line and wherein the at least one core (104) is located around the primary wire (3).

U3. Use according to the preceding embodiment, wherein the primary wire (3) conducts a current of at least 100 Ampere, preferably at least 300 Ampere, more preferably at least 1,500 Ampere.

U4. Use according to any of the 2 preceding embodiments, wherein the use comprises generating a power output, which is used by surveillance equipment for the high-voltage power line.

U5. Use according to any of the preceding use embodiments, wherein the system comprises the features of embodiment S25, wherein the use comprises
the controller units changing the state of their respective shunt units only at zero crossing states of the alternating current.

U6. Use according to any of the preceding use embodiments, wherein
for a first secondary winding, the respective shunting unit shorts the ends of said first secondary winding, when a voltage across the load element exceeds a first threshold.

U7. Use according to the preceding embodiment, wherein
for a second secondary winding, the respective shunting unit shorts the ends of said second secondary winding, when a voltage across the load element exceeds a second threshold.

U8. Use according to any of the 2 preceding embodiments, wherein
for a further secondary winding, the respective shunting unit periodically shorts the ends of said further secondary winding, when a voltage across the load element exceeds a further threshold.

S35. System according to any of the preceding system embodiments, wherein the system is configured for the use according to any of the preceding use embodiments.

The present technology will now be discussed with reference to the accompanying drawings, which are intended to exemplify, but not to limit the present invention.

DESCRIPTION OF EMBODIMENTS

In embodiments, the present invention is used to "harvest" electric energy from an electromagnetic field surrounding an AC current carrying phase wire—this is why the described apparatus (or system) may also be referred to as a power on line generator (and may be abbreviated with the abbreviation POLG). The harvested electric energy may then be converted to a stable DC power supply for the purpose of power feeding electronic measurement and/or surveillance devices. That is, in other words, the power harvester or the POLG may be used to provide additional components with power, which additional components may be used, e.g., for surveillance of a power line.

Some components in the electrical energy harvesting circuitry may be current transformers. The POLG design may utilize a plurality of current transformers that are clamped or otherwise located in a fixed manner onto a phase wire for the purpose of maximizing electric energy harvesting from the electromagnetic field surrounding the phase wire. To exemplify; if one current transformer harvests 10VA from a phase wire at 200A then two identical current transformers will double the energy harvesting thus generating 20VA. Six current transformers therefore will generate 60VA from the electromagnetic field of a phase wire at 200A.

Figure 9:
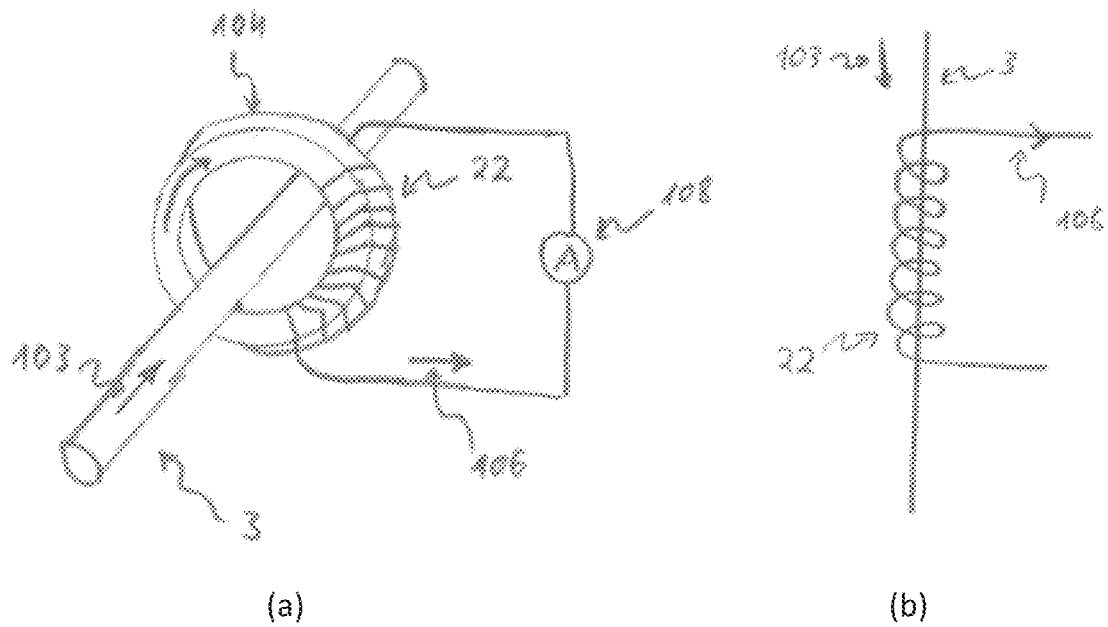
FIG. 9 depicts a general setup of a current transformer.

It will first be described how a current transformer (which may also be employed by the present technology) generally works. The current transformer may be designed for measuring currents in high voltage power lines and/or high current circuits where other means wouldn't apply. A primary wire, also referred to as a phase wire 3 (see FIG. 9 (*a*)), is used for conducting a primary current 103. For example, the primary wire 3 may be a wire in a power line, and may be used for overland transport of energy. Around the wire, a core 104 (transformer core with window opening for the primary wire/conductor) may be located. The core 104 may be made of a high permeability material such as silicon steel and permalloy or an iron based nanocrystalline alloy material. The primary current 103 in the primary wire 3 causes a magnetic field in the core 104. Furthermore, a secondary winding 22 may be wound around the core 104. The magnetic field 104 in the core causes a secondary current 106, which can generally be measured by a current meter 108. This can also be represented by the simplified FIG. 9 (*b*).

Figure 10:
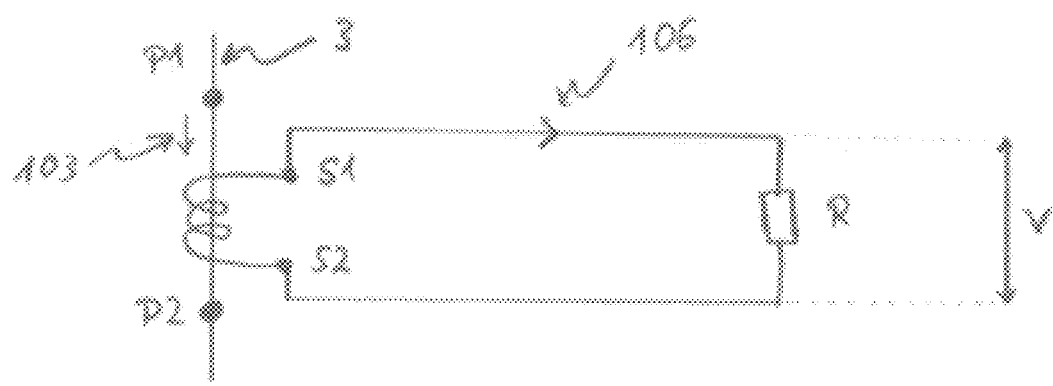
FIG. 10 depicts a general setup of generating a voltage and a power from a secondary winding of a current transformer.

The primary current 103, which may be a AC current, may also be converted to a secondary AC voltage, by connecting a resistor (a burden) R of certain value across the secondary winding terminals—see FIG. 10 in this regard. Here, again a primary current 103 may flow between points P1 and P2 in primary wire 3, causing a secondary current 106 between points S1 and S2 in the secondary wire. A resistor or burden R may be used in between points S1 and S2 in the secondary wire. That is, AC voltage level across the burden R is then measured as a AC voltage value. The AC voltage values may thus be translated to proper AC amperage values. For example, consider the situation of the primary current 103 being 1000 A, which is translated into a secondary current 106 of 5 A. When there is a zero burden, corresponding to a resistance R being 0 Ohms, the voltage V would be zero. This is the situation of a short circuit. However, if the resistance had 5 Ohms, this would result in a voltage V of 2.5 V, and a power output of 12.5 VA. Correspondingly, a resistance of 5 Ohms would result in a voltage of 25 V and a power output of 125 VA. It is thus possible to convert the primary current 103 via a secondary current 106 into a voltage and a power output. This principle is also used by the present technology to transform a primary current 103, e.g., a current in a powerline, to a secondary current, voltage and power output, to thus supply additional components with electrical power.

That is, in other words, the discussed components may be used to transform a primary current into a secondary current and further into a power output. In other words, the discussed current transformers experience the DC load (the DC power extraction) as a variable burden.

That is, when little power demand is presented by the POLG power supply, the current transformers see that as a high restive load (burden) and visa-versa. When presented with high resistive burden, the AC voltage across the secondary terminals rises and if the load (burden) has low resistance value, the AC voltage across the terminals drops.

Figure 1:
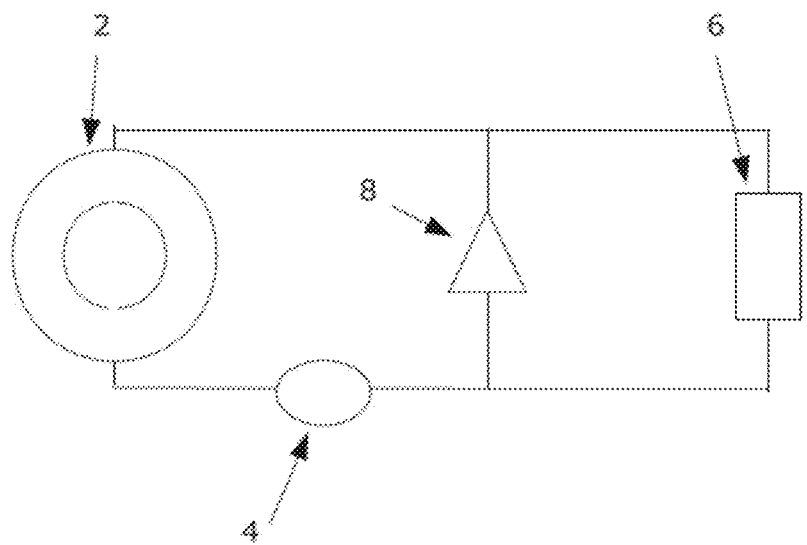
FIG. 1 depicts a schematic embodiment of a device for power extraction, in accordance with an embodiment of the present invention.

FIG. 1 depicts a schematic embodiment of the device according to the invention. The device for power extraction comprises an extracting component 2. The extracting component 2 is configured to extract power from electrical conductors and can also be referred to as current transformer 2. Such electrical conductors can comprise power lines, preferably AC current carrying power lines, such as the primary wire 3 discussed above in conjunction with FIG. 9. The power can be extracted in the form of current induced in the extracting component 2. The extracting component 2 can comprise a high permeability material such as silicon steel and permalloy or an iron based nanocrystalline alloy transformer core placed around a phase wire 3 (such as a phase wire of a power line, which can also be referred to as primary winding). A secondary winding can be placed around the transformer core. Electrical current passing through the electrical conductor can then induce current in the secondary winding, therefore leading to power extraction, as discussed above.

The device may further comprise a zero crossing component 4. The zero crossing component 4 is, in this embodiment, placed in series with the extracting component 2. The zero crossing component 4 can detect when the waveform of the current induced in the extracting component 2 passes through zero points.

The figure further depicts a load component 6, which may also be referred to as a resistive element, in accordance with the discussion of FIG. 10 above. The load component 6 ensures that voltage is generated across the circuit with the extracting component 2. The load component 6 can comprise a resistor. The load component 6 can comprise a variable load that is automatically adjusted depending on the current circulating in the phase wire and/or the desired voltage across the device circuit.

Furthermore, a shunting component 8 is depicted. The shunting component 8 is configured to shunt the device circuit in such a way that no current runs through the load component 6, i.e. the shunting component 8 is configured to short the circuit depicted in FIG. 1 (and, in particular, in the embodiments below, the secondary winding). In other words, the shunting component 8 can ensure than no voltage is generated across the circuit. The shunting can be done when a certain voltage across the load component 6 is exceeded (which may occur when a certain current in the phase wire is exceeded.) The shunting can prevent damage to the electronics of the device. The shunting component 8 preferably comprises MOSFET-based transistors to avoid voltage spikes and/or drops in the system and associated power losses and heat generation.

The device is preferably used to monitor and survey power lines carrying currents across long distances. The extracting component 2 comprising a transformer core and a secondary winding around it is placed around the phase wire so as to induce current in the secondary winding. This current then generates voltage across the winding due to the resistive load 6 placed across its terminals (the DC power output of the system). If the voltage becomes too high across the system, the shunting component 8 can shunt the extracting component 2 when the waveform of the induced voltage is passing through a zero point (to avoid voltage spikes across the secondary winding terminals and therefore preventing electrical and mechanical disturbance in the current transformer). The power generated by the induced current can be used to power the electronics and preferably diagnostic devices and sensors. In this way, the power extracting device can be used to monitor the status of the power line from which it extracts the power.

Figure 2:
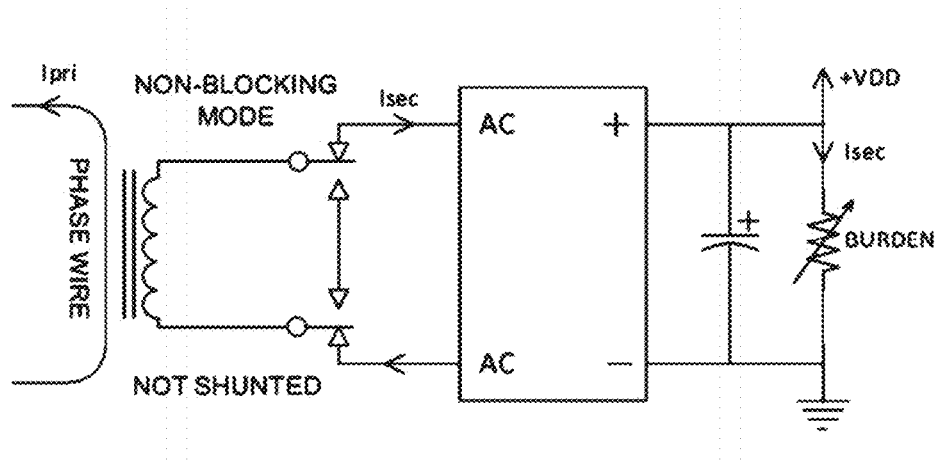
FIG. 2 depicts a device for power extraction in the not shunted and shunted configuration, respectively, in accordance with an embodiment of the present invention.
Figure 2:
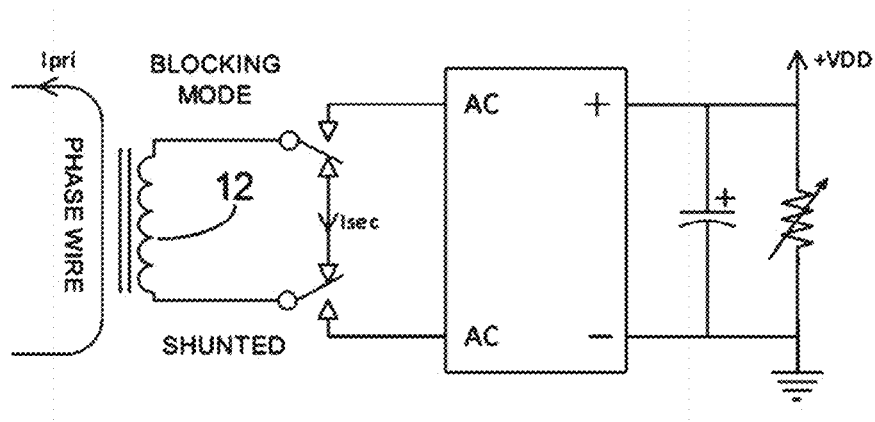

FIG. 2 shows another depiction of the device for power extraction. Secondary winding 22 is depicted next to a transformer core 104 and phase wire 3 which induces the current in the device's circuit. The load component 6 is shown as a resistor 6. Also depicted is the shunting component 8, which preferably comprises MOSFET transistors. The left sketch shows the shunting component 8 in an open configuration. That is, the current is free to circulate in the circuit including across the load component 6. The right sketch shows the shunting component 8 as closed: induced current no longer circulates in the load component 6, as the circuit has been short-circuited via the shunting component 8. It will thus be understood that the term shunting as used herein denotes the creation of a short circuit.

A rectifier, which may be realized as a rectifying bridge 10, is configured to convert the AC current induced by the AC current-carrying phase wire 3 into DC current that can be used to power the power extraction device's electronics. The rectification bridge 10 can comprise MOSFET transistors which can advantageously ensure power generation without (substantial) power losses and the associated heat generation. Shunting the secondary winding 22 does not impose any electrical or mechanical disturbances to the associated current converter 10, as it is left out of the short-circuited circuit as shown on the right sketch.

The shunted circuit can comprise a very low resistance such as about 8 mΩ or less. Shunting the circuit leads to the induced current circulating only within the current transformer 2, so that the voltage level across the secondary winding 22 is substantially zero, and power transfer to the associated rectification bridge 10 and the load component 6 is cut off.

In other words, shunting the secondary winding 22 of a current transformer does not impose any electrical or mechanical disturbances to the associating transformer. In fact, it can be said that the normal state of a current transformer is the one where the secondary winding terminals are shorted (i.e., shunted). The presently discussed POLG design takes advantage of this fact and utilizes it for the purpose of voltage and power regulation of the whole power generating system, and FIG. 2 shows a simplified block diagram of the current path of a non-shunted secondary winding 22 (see left Figure) and a shunted one (see right Figure).

As can be seen on the left hand side of FIG. 2, the secondary winding 22 of the current transformer is connected to the associated rectification bridge 10 and from there to the common DC load 6 (the burden, also referred to as the resistive element). If for some reason the power generation of the harvesting circuit must be limited due to insufficient load on the burden side or an excessive current on the phase wire side, the control logic totally shunts the secondary winding 22 of that particular transformer as shown on the right hand side of FIG. 2.

As discussed, the shunt circuit may insert a very low resistance path between the current transformer winding terminals (less than 8 mΩ across the terminals) and may totally short circuit the secondary winding 22 so all current generated circulates within the transformer. The voltage level across the secondary winding 22 therefore drops to zero and all power transfer to the associated rectification bridge and the DC load (the common burden) is cut off.

Figure 3:
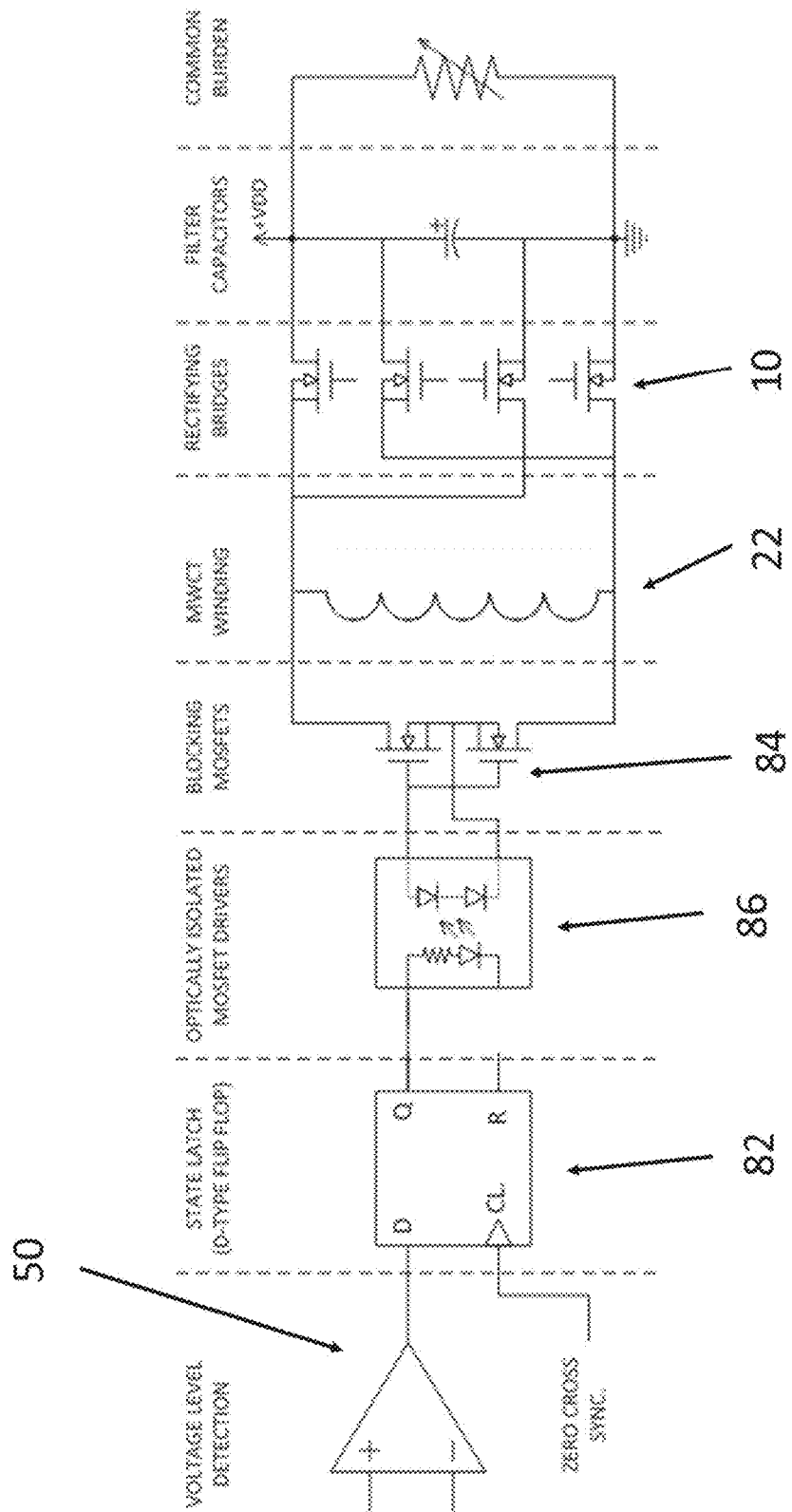
FIG. 3 depicts a section of a system according to an embodiment of the present invention in more detail.

FIG. 3 depicts a shunting and rectification circuitry of the device for power extraction. The secondary winding 22 is shown towards the right side of the figure, followed by the current converter 10 depicted as rectification bridges 10. On the left hand side of the figure, circuitry related to the zero crossing component 4 and the shunting component 8 is depicted. A DC voltage component 50 serves as an input for controlling operation of shunting units. The DC voltage level component 50 is configured along with state latch 82 to turn the shunting component 8 on and off. Circuit driver 86 along with blocking transistor pair 84 provide the shunting mechanism. Both the circuit driver 86 and the blocking transistor pair 84 preferably comprise MOSFET transistors. The usage of those allows for minimization of power losses and heat generation in the system.

That is, FIG. 3 shows a simplified block diagram of a rectification circuitry. It will be understood that each current transformer winding may have its own rectification circuitry. For example, if we consider a POLG unit having six current transformers in the setup and it is supposed to be able to handle phase wire currents ranging from 0-300 amperes, it may be possible to control the resistive value of the DC load (burden) presented to the secondary windings. The method the POLG design applies is to dynamically exclude the current transformers from the power generation by shunting them one by one depending on the overall DC voltage level at the DC side of the rectification bridges, as will also be discussed in more detail below.

Figure 4:
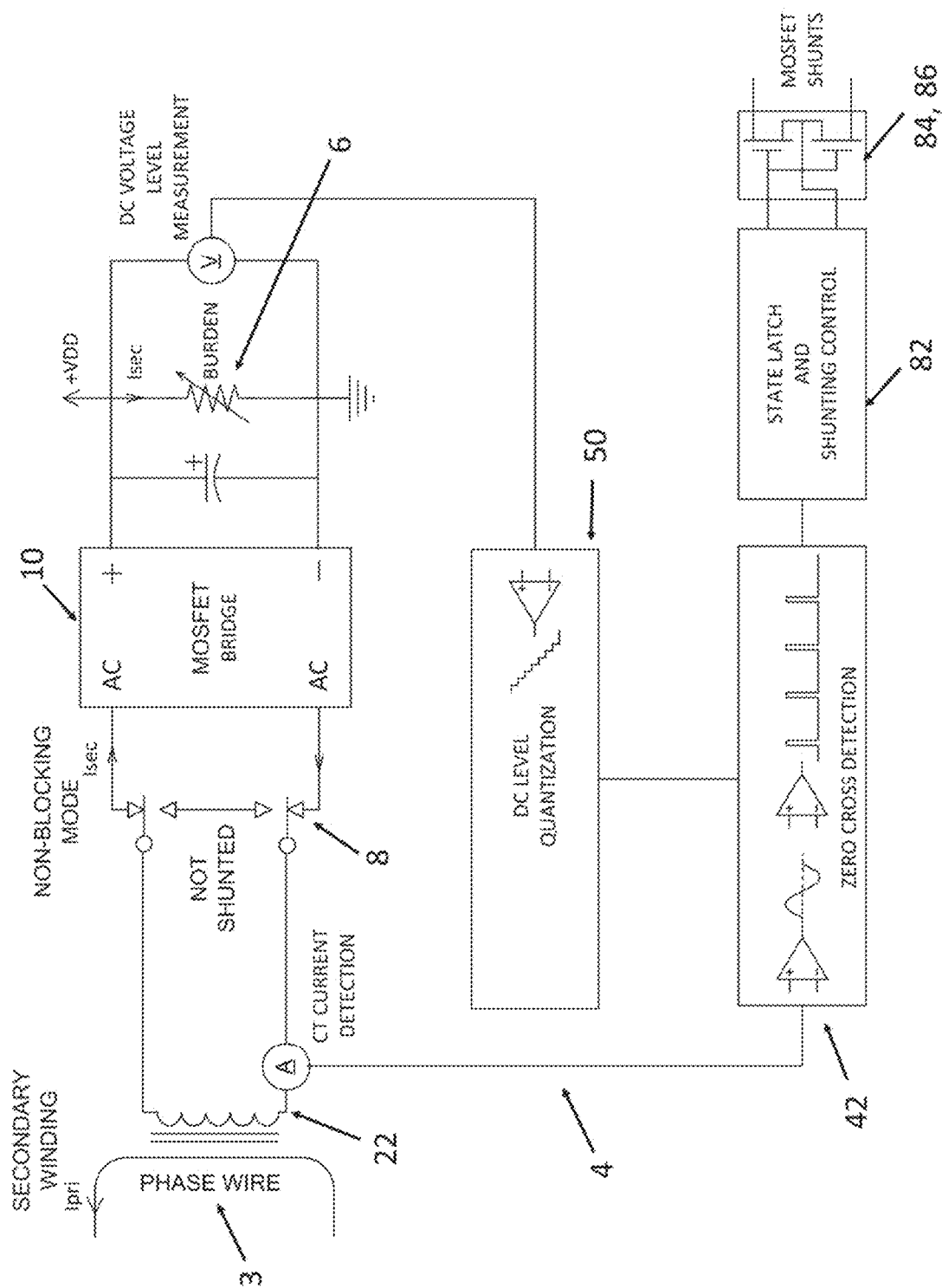
FIG. 4 depicts another section of a system according to an embodiment of the present invention in more detail.

FIG. 4 depicts the zero-crossing component of the device in more detail. The secondary winding 22 is depicted inducing current from the phase wire 3. The shunting component 8 is off, as indicated by the current passing through the circuit towards the current converter 10. The load (or burden) 6 is shown on the DC side of the circuit as the resistor 6. The zero crossing component 4 is shown connected in series with the secondary winding 22. The zero crossing component 4 preferably comprises a galvanically isolated current sensor that inserts very low resistance in the secondary winding circuit. This resistance can be about 1 mΩ or less, such as about 0.65 mΩ. This can ensure that very little power is dissipated and very little heat generated in the circuit due to the zero crossing component 4.

Zero crossing detector 42 detects the zeroes of the current waveform travelling in the secondary winding circuit and generates pulses accordingly. The zero crossing detector 42 can comprise, for example, a Hall effect sensor. The generated pulses are then passed on to the state latch 82, which, along with the DC voltage component 50, controls the shunting of the circuit via the shunting component 8, shown here as the blocking transistors 84 (preferably MOSFETs) and the optically isolated circuit drivers 86.

One advantage of the present implementation of the zero crossing component 4 may be that it is based on measuring the induced current, rather than the induced voltage across the load component 6. This allows the zero crossing component to be placed on the AC side of the circuit, where it is not affected by the shunting via the shunting component 8. In other words, the zero crossing component 4 can continue to detect the induced current's waveform's zeroes even when the secondary winding circuit is shunted and no voltage is induced in the load component 6.

In embodiments using a plurality of current transformers, all the current transformers and their participation in the power generation may be regulated in the same manner, that is they may be totally shunted one by one in sequential order. The power control circuitry comprises an autonomous analogue circuitry, commonly powered by the secondary windings. As discussed, the power control circuitry uses galvanically isolated current sensing circuitry that is connected in series with one of the secondary windings for the purpose of a zero-crossing detection, as depicted in FIG. 4. The output of the current sensor is used to provide the zero-crossing detection enabling the DC voltage quantization circuit and the level status latch to turn the MOSFET current transformer shunts on and off in the zero-crossing state of the current transformers, thus minimizing possible voltage spikes generated across the secondary windings and/or creating electric or mechanical disturbance in the current transformer circuits. The galvanically isolated current sensor may insert only 0.65 mΩ resistance in the secondary winding path thus imposing non or negligible power loss or heat generation in the secondary winding circuit.

Figure 5:
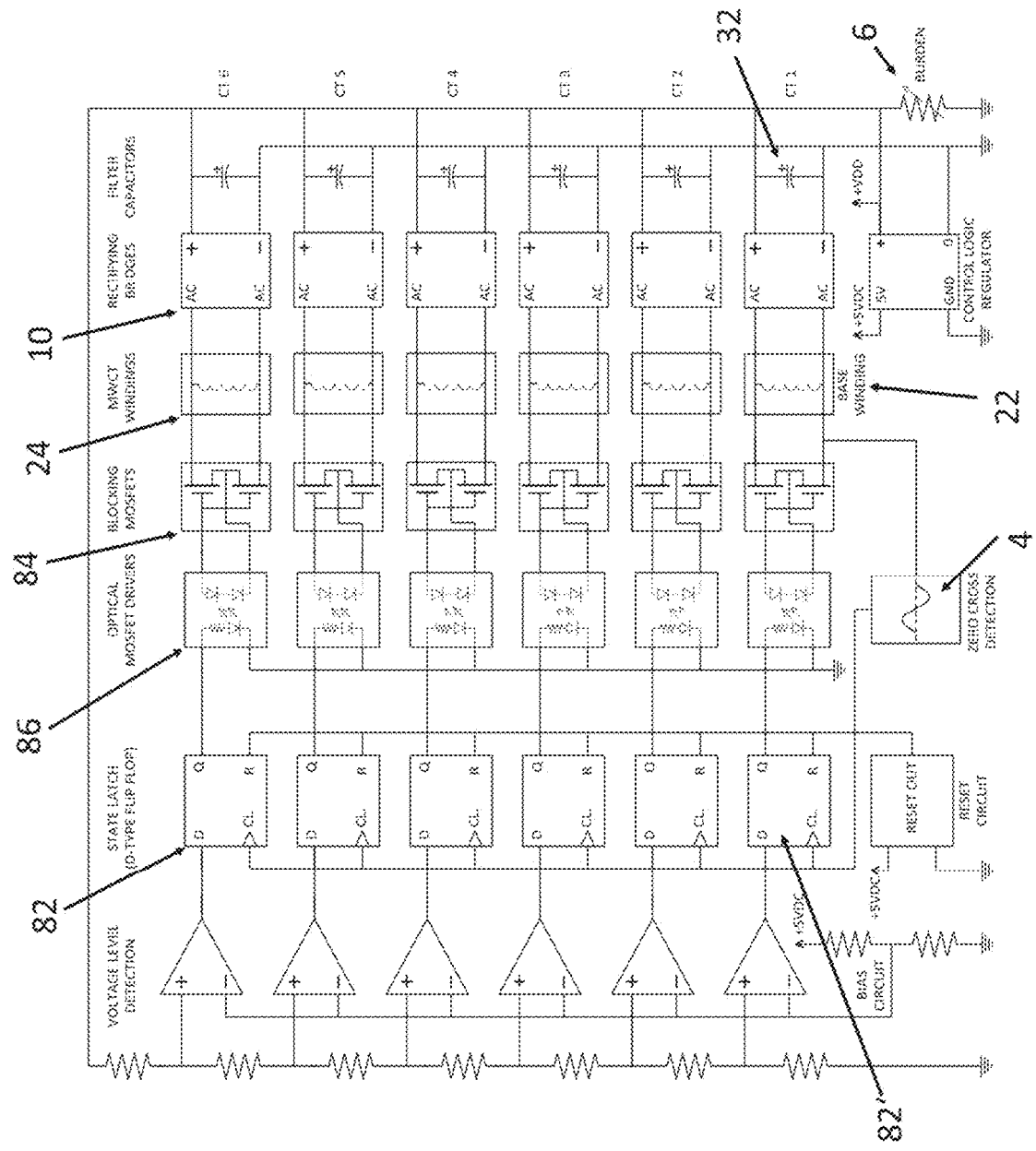
FIG. 5 depicts a system for power extraction, according to an embodiment of the present invention.

FIG. 5 schematically depicts a combination of a plurality of devices for power extraction. The particular advantage of the present invention is that multiple such devices can be combined on the DC side of the respective circuits, so that the power extracted by all of them can be added, but each of them can still be individually shunted to effectively regulate power extraction. This can be implemented as multiple secondary windings 22 placed on the same transformer core clamped around a phase wire, and/or a plurality of transformer cores, each with its own secondary winding 22, and/or a combination of the two.

Figure 8:
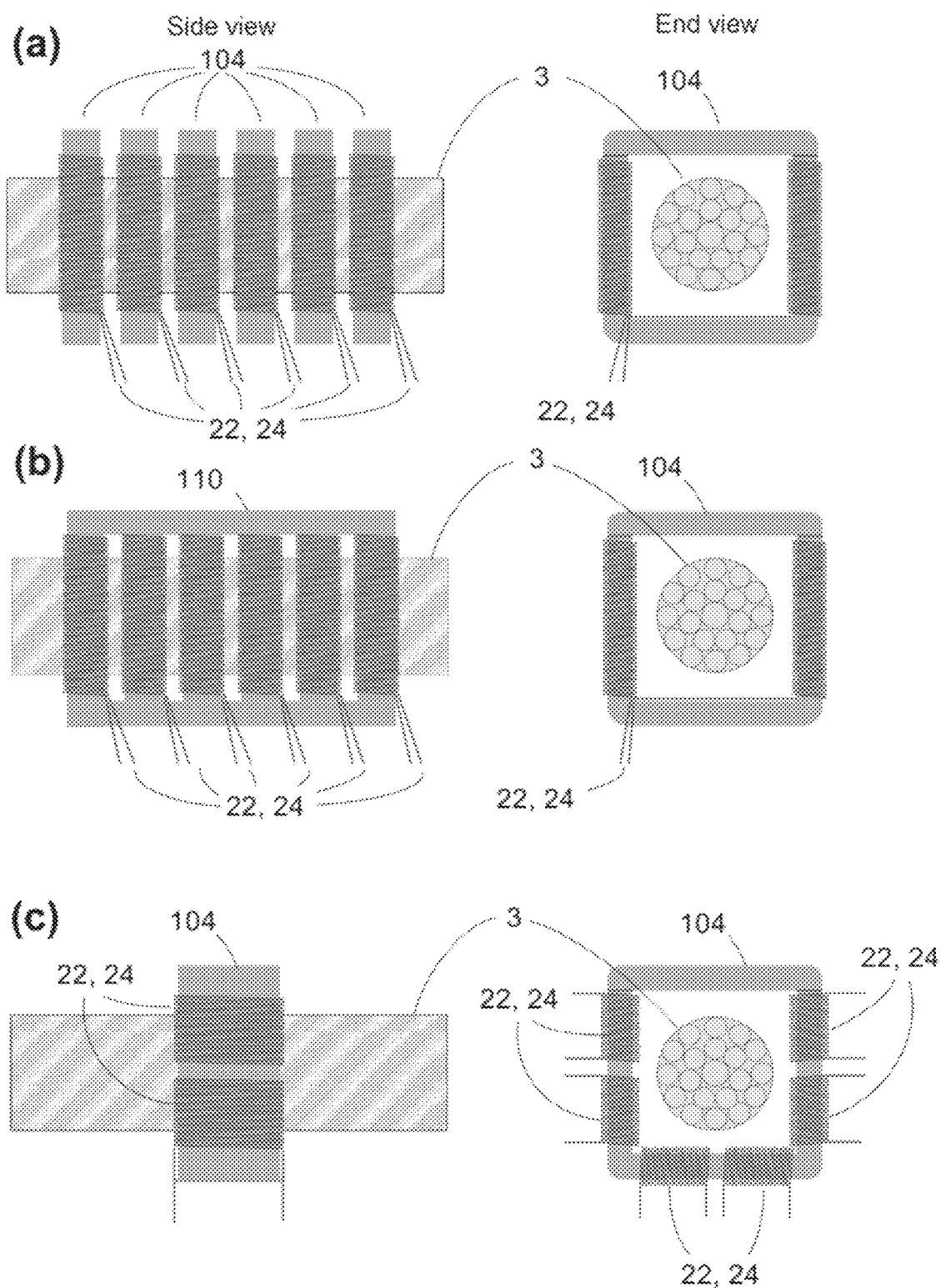
FIG. 8 depicts different possible configurations of secondary windings arranged around one or more transformer cores.

Different configurations of at least one transformer core 104, a plurality of secondary windings 22, 24 and a primary wire 3 are depicted in FIG. 8. Generally, the at least one transformer core 104 (i.e., one or more transformer cores 104) is arranged around a primary wire 3, which primary wire 3 carries an alternating current (AC). Further, a plurality of secondary windings 22, 24 are arranged around the at least one transformer core 104.

According to one embodiment depicted in FIG. 8 (a), the at least one transformer core 104 is a plurality of transformer cores 104. More particularly, the number of secondary windings 22, 24 may equal the number of transformer cores 104, and each secondary windings 22, 24 may be arranged around one transformer core 104.

In another embodiments, the transformer cores 104 may also be connected to one another to thus form a transformer core unit 110, as depicted in FIG. 8 (b), with similar characteristics as the plurality of transformer cores 104 depicted in FIG. 8 (a).

In a still further embodiment depicted in FIG. 8 (c), only one transformer core 104 is provided and a plurality of secondary windings 22, 24 is arranged around this single transformer core 104.

It should be understood that the present invention also relates to the combination of the transformer core characteristics depicted in FIGS. 8 (a) to (c). E.g., it is also possible to provide more than one transformer core unit 110, and it is also possible to provide more than one transformer core 104 with a plurality of secondary windings 22, 24. All this is encompassed by the present invention.

FIG. 5 depicts six devices combined to extract power from a power line. One (e.g., the first) secondary winding 22 has the zero crossing component circuitry connected to it, but otherwise is not different from the additional secondary windings 24. All of the secondary windings 22, 24 can comprise a single common load 6, since it is placed on the DC side of the circuit. Each secondary winding 22, 24 comprises its own shunting component 8 (depicted in the figure as the blocking transistor pairs 84 and the circuit drivers 86), so that each of the windings can be independently shunted for precise regulation of overall power extraction. That is, each secondary winding may comprise a shunting unit 84 and a shunt controller unit comprising state latch 82 and driver 86. All of the secondary windings 22, 24 can also provide power for the basic electronic circuitry (i.e. the analog and control logic, the zero crossing detection etc.) and for any sensors implemented as part of the power extraction device.

That is, the embodiment of the POLG depicted in FIG. 5 comprises multiple current transformers that may be added to or excluded from the energy harvesting circuitry depending on the available phase wire current on one hand and the power needed (the DC output power extraction) on the other hand. The special designed current transformers in the design have relatively high knee-point core-saturation voltage that gives up to 35 VAC output across the secondary windings depending on the burden presented by the power supply (the external load connected to it). The usable AC voltage range for proper DC rectification may be in the range of 9 to 35 volts AC.

The electric energy harvesting summing may be applied at the DC side of the rectification bridges, that is, the windings may not be connected together before the rectification bridges (winding to winding), as is also depicted in FIG. 5. Because of the inherent physics of current transformers and the difficulty in regulating the fluctuating current flow and AC voltage level to a usable DC power, the discussed embodiments of the POLG generating system is based on the idea of having one or more secondary windings working together forming a joint power generating system. When needed one or more of those secondary windings are dynamically shunted, excluding them from the joint power generation of the secondary windings.

Figure 6:
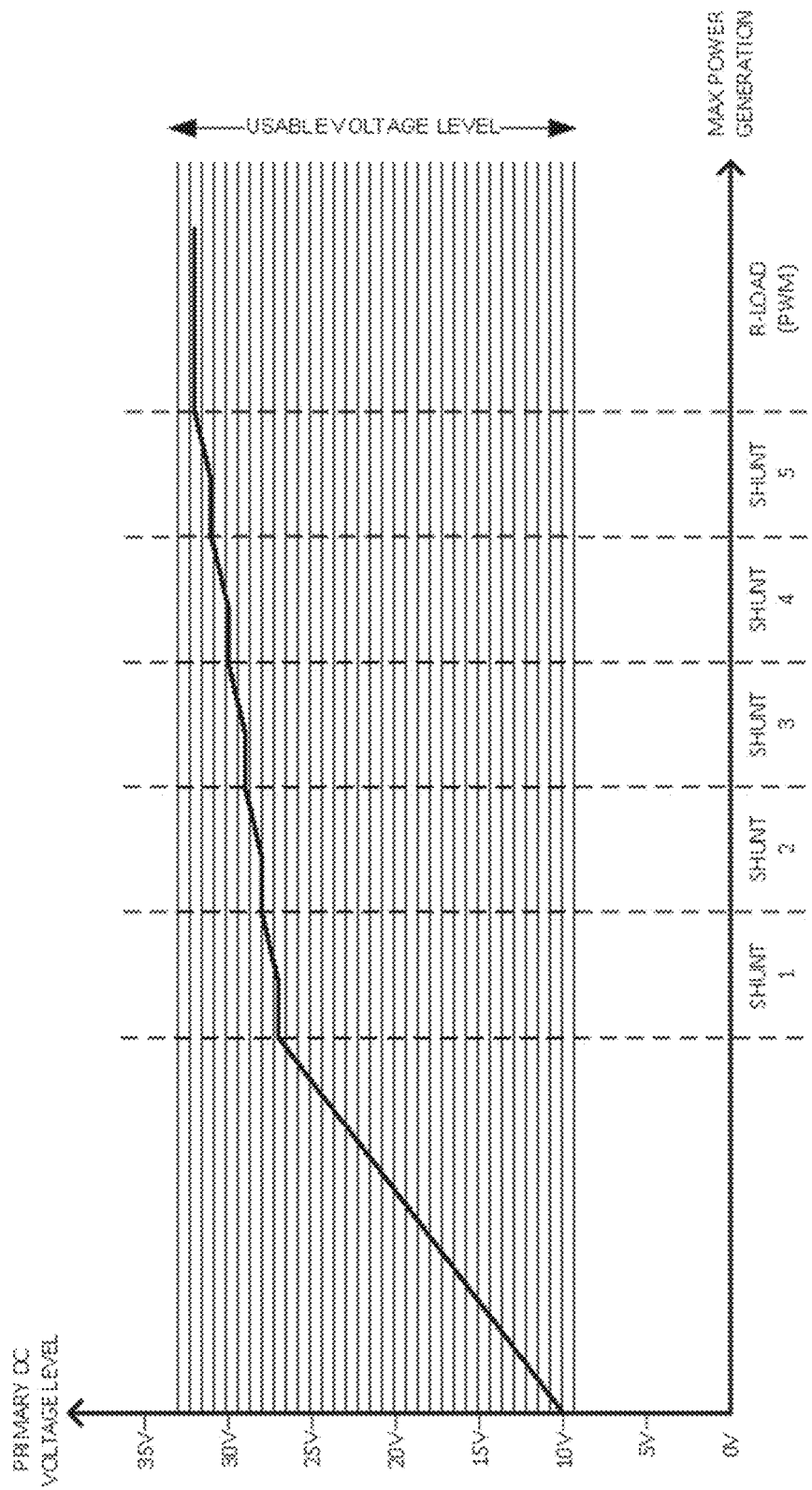
FIG. 6 depicts a schematic representation of the extracted voltage while operating a plurality of devices according to an embodiment of the present invention together.

FIG. 6 depicts a schematic graph of the DC voltage level as a function of the maximum current circulating in the phase wire (and therefore the induced current circulating in the secondary windings, since it is proportional). The graph is depicted for an exemplary embodiment comprising six secondary windings 22, 24. The DC voltage rises with rising current, until a certain threshold value, at which point the secondary windings 22 start getting shunted. In this exemplary embodiment, the shunts start kicking in at about 27 V DC. The precise threshold for the shunting components 8 to start shunting the secondary windings 22 can be set based on the desired power generation and on the limits of the electronics used in the circuit. As the phase wire current continues to rise, more shunts are applied, until all six windings are shunted. In this regard, it is noted that the last shunt usually is not applied permanently, but only intermittently, i.e., in a pulsed manner, to thereby only partially exclude it from the power generation. All of the shunts are applied at the zero crossing of the induced voltage to avoid spikes in voltage across the circuits.

It will also be understood that the DC level at the DC side of the rectification bridges may not be completely flat and stable. Even though it is smoothed with relatively large capacitance it fluctuates a little with respect to the changes in the phase wire current and similar changes in the DC power usage of the POLG unit (the DC load). The shunting circuitry starts to kick in when the DC voltage level reaches the 27 volts DC level and the first current transformer winding is shunted. If the DC voltage continuous to rise more current transformer windings are shunted and in that way excluded from the power generation, as is depicted in FIG. 6.

Figure 7:
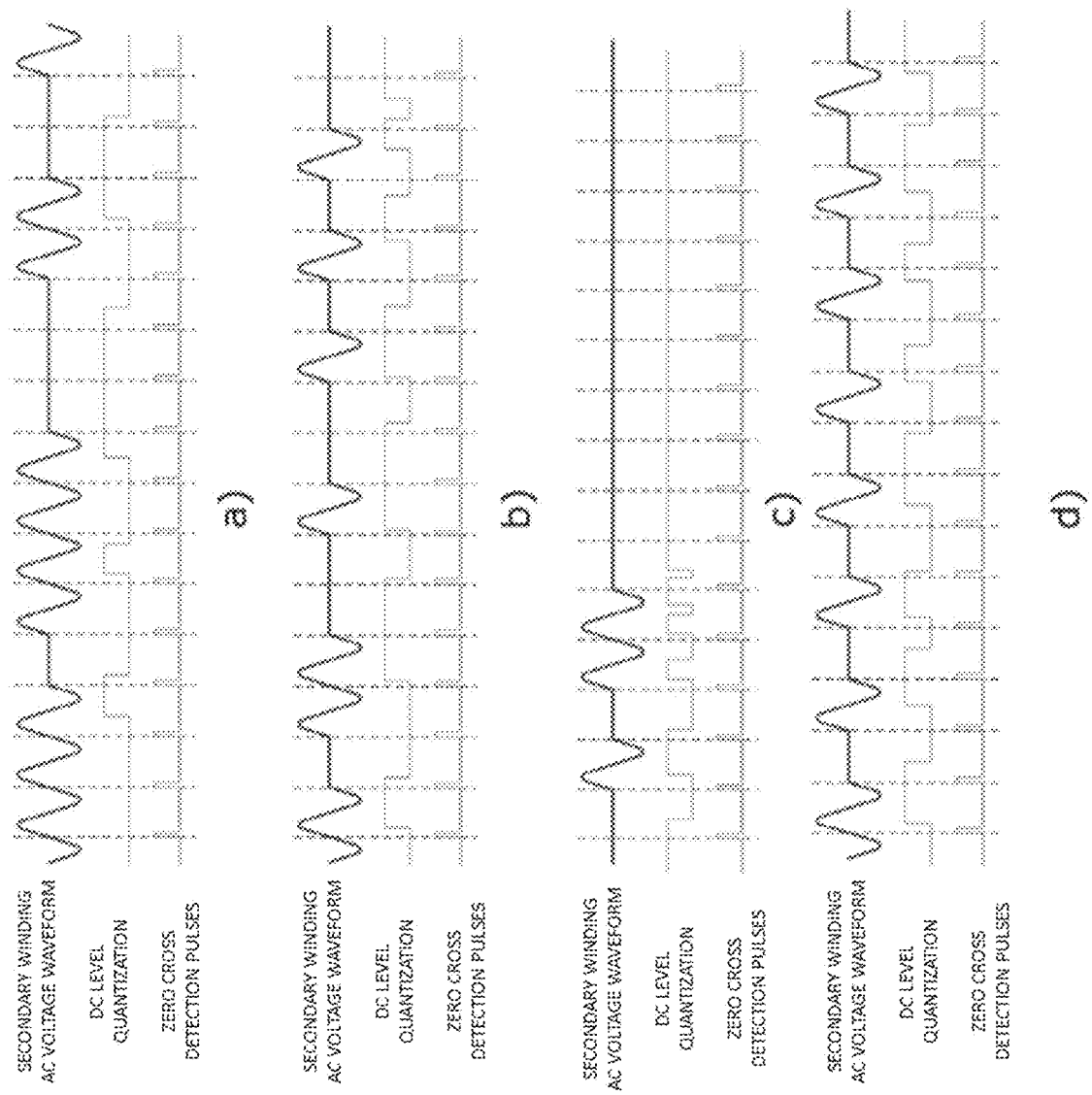
FIG. 7 depicts the waveforms of the induced voltage and of the shunting mechanism according to one embodiment of the invention.

FIG. 7 depicts the AC voltage waveforms of the secondary winding when the DC voltage reaches the shunting threshold, wherein FIGS. 7 (a) to (c) relate to one secondary winding that is finally permanently shunted, see FIG. 7 (c). FIG. 7 (d) shows the waveform of the last secondary winding that is never totally shunted, but where the shunting is applied as a train of shunt pulses. Sketch a) shows a ripple in the DC voltage, which causes the DC quantization circuit to occasionally apply shunting. The zero crossing pulses are also shown: the shunting is applied at the zero points of the AC voltage to avoid spikes in the system. Sketch b) depicts a slightly increased DC level voltage. The DC quantization circuit is applied more frequently as depicted by more frequent pulses. Sketch c) shows a further increased DC voltage level, and the shunting is applied permanently. Sketch d) depicts a sequential blocking (i.e., shunting) and non-blocking (i.e., un-shunting) of a secondary, winding, e.g., the sixth and last secondary winding. This may be applied at a very high overall DC voltage level. In this embodiment, all but the last of the secondary windings have been shunted, and the last one is sequentially shunted and non-shunted, to allow for smooth and stable overall power generation.

As discussed, each winding may have its own shunting circuitry (MOSFET shunt). In a setup with six current transformers, the DC level quantization circuitry has six logic level outputs, one for each of the current transformers. These logical levels will also be referred to as voltage level state inputs for the shunt controller unit. They are typically generated by a system control unit and based on the DC voltage level at the load. The DC voltage quantization circuit and the level status latch turns the MOSFET shunts on and off in the zero crossing state of the phase wire current. As discussed, FIGS. 7 (a) to (c) depict the AC voltage waveforms of one secondary winding when the DC voltage reaches the blocking level. Again, as discussed, FIG. 7 (a) depicts how a ripple in the DC level causes the quantization circuit to occasionally apply the blocking mechanism; FIG. 7 (b) depicts how the DC level has increased slightly, causing the quantization circuit more frequently applying the blocking mechanism; FIG. 7 (c) depicts how the DC level has increased still more, causing the quantization circuit permanently applying the blocking mechanism.

If increasing the DC level even further, the first secondary winding may at some point be shunted permanently. The same may apply to all the other secondary windings, but one. That is, at very high DC levels, all but one secondary winding may be shunted permanently. The secondary winding that is not shunted permanently may still be shunted periodically. Consider, e.g., the situation that the AC current in the primary winding is so high that even when using only one permanently non-shunted secondary winding, the resulting DC voltage would be higher than necessary, and potentially even harmful for the equipment. In such a situation, this secondary winding may be shunted periodically, to only generate a part of the power that would be created if it was permanently non-shunted. This configuration of the last non-shunted secondary winding is depicted in FIG. 7 (d). That is, it relates to a situation where the first current transformers of a transformer setup have been blocked. In such a situation, the last one is not blocked permanently but instead every other AC cycle, or series of AC cycles, are blocked and un-blocked sequentially to stabilize the power regulation.

It will be understood that the shunting follows the following logic: A shunting occurs when the following condition is met: The DC level quantization is 1 (or high) when a zero crossing occurs. Only in this situation, the presently discussed embodiment shunts the respective secondary winding. The un-shunting is performed when: The DC level quantization is 0 (or low) when a zero crossing occurs.

It will generally be understood that when using conventional methods when rectifying AC voltage to DC voltage, this can impose considerable power losses due to the inherent silicon voltage drop across diodes in the rectification bridges. This specially applies at low voltage levels and high currents. To avoid this the POLG design may in some embodiments use MOSFET transistors instead of diodes in the rectification bridges. When fully conducting, the MOSFET transistors may impose negligible series resistance (less than 4 mΩ) instead of the relatively large silicon voltage drop that conventional diodes do and therefore almost eliminates power losses due to silicon voltage drops and the associated heat generation.

MOSFETs may also be used as current shunts for the secondary windings and for all other high current switching circuits in the power harvesting circuitry. This may be advantageous bearing in mind that the electronic circuit boards of the POLG device are located in a very confined compartment. Therefore, the use of MOSFETs with low RDS-on values for intensive current switching may be advantageous for keeping the heat generation inside the device at a minimum but the power efficiency at the maximum.

To further illustrate embodiments of the present invention, an exemplary operation of the system will now be described with primary reference to FIGS. 4 and 5. Consider the situation that there is an increasing alternating current in the phase wire 3 (also referred to as primary wire 3). Furthermore, consider that the power generation system is used to power surveillance equipment needing a DC voltage in the range of 20 V to 33 V.

The alternating current in the phase wire 3 causes a magnetic field in the one or more transformer cores 104 and thus an alternating current in the secondary windings 22, 24 (see FIG. 5), which may be referred to as secondary alternating currents. In the beginning (and when the alternating current in the phase wire 3 is still small), there may be no need to limit the voltage and power output of the system, which is why the shunting units 8 may be deactivated, i.e., in the non-shunting configuration. The secondary alternating currents may thus be transformed to direct currents in the rectifiers 10, which may be rectification bridges. The DC sides of the rectifiers 10 may be connected to the load component 6 (e.g., the power unit of the surveillances equipment) in parallel, such that the direct current are added to one another.

Thus, the overall DC voltage output at the load 6 may be the sum of the (hypothetical) voltage outputs after each rectifier 10.

Consider now the situation, that with all (here: 6) secondary windings 22, 24 in the non-shunted state, a primary alternating current of, e.g., 100 Ampere would lead to an overall DC voltage output at the load 6 of 10 V. That is, each secondary winding unit would be responsible for approximately 1.67 V.

When, in this configuration, the current in the primary wire rises to 200 Ampere, this would lead to a DC voltage output of 20 V. At 260 Ampere AC, this would lead to a voltage output of 26 V.

As depicted, e.g., in FIGS. 4 and 5, the system measures the overall DC voltage output by means of a voltage level detection and quantization circuit 50, which may also be referred to as the system control unit 50. When a certain threshold is exceeded (e.g., 26 V), the DC level quantization circuit 50 may instruct one secondary winding 22, 24 to be shunted, i.e., to be shorted.

To do this, the DC level quantization circuit 50 may send a voltage level state input to the shunt controller unit 82' of the respective shunt unit 86 to be shunted.

Furthermore, there is also provided a current sensor in series with one of the secondary windings 22. The secondary AC signal is thus obtained and a zero crossing component extracts the zero crossings of the secondary AC signal. These zero crossings pulses may also be fed to the shunt controller units 82 as a clock signal, and the shunt controller unit 82' may thus ensure that the secondary winding 22 is only shunted at the zero crossings (this is also depicted in FIG. 7).

As discussed, 260 Ampere AC in the primary wire may exemplarily lead to 26 V when all six secondary windings 22, 24 contribute to the DC voltage generation. When one secondary windings is shorted, this would lead to 21.67 V on the DC side (=26 V*5/6).

As this would be below the threshold for shunting the first secondary winding, this secondary winding would again be un-shunted. In reality, the voltage on the DC side would not immediately drop down to 21.67 V, due to some delay, also caused by the capacitors 32. Instead, the voltage level would drop down to slightly below 26 V, then the respective secondary winding would be un-shunted until the voltage level is slightly above 26 V, and so on.

Following this reasoning, there may be different DC voltage thresholds in the DC level quantization circuit 50 for shunting the different secondary windings. That is, the DC level quantization circuit 50 may send respective shunting instructions (in the form of voltage level state inputs) to the different shunt controller units 82. As discussed, e.g., the first secondary winding 22 may be shunted when the overall DC voltage exceeds 26 V, the second secondary winding 24 may be shunted when the DC voltage exceeds 27 V, and so on (though these values are merely exemplary).

Thus, one may arrive at a relatively constant DC voltage output, which is independent of the AC current in the primary wire 3.

The above control logic leads to the last secondary winding 24 never being shunted permanently. Consider, e.g., the case that the threshold for shunting for last secondary winding 24 is at 31 V at the DC side. Again, once this threshold is exceeded, the last secondary winding will be shunted, leading to the direct current and thus the DC voltage decreasing. Once it decreases below 31 V, the last secondary winding 24 will be un-shunted again. Thus, the last secondary winding 24 will not be shunted completely, but only in a "pulsed manner".

While in the above, particular embodiments of the present invention have been described, it should be understood that they were merely described to exemplify, but not to limit, the scope of the present invention.

Whenever a relative term, such as "about", "substantially" or "approximately" is used in this specification, such a term should also be construed to also include the exact term. That is, e.g., "substantially straight" should be construed to also include "(exactly) straight".

Whenever steps were recited in the above or also in the appended claims, it should be noted that the order in which the steps are recited in this text may be the preferred order, but it may not be mandatory to carry out the steps in the recited order. That is, unless otherwise specified or unless clear to the skilled person, the order in which steps are recited may not be mandatory. That is, when the present document states, e.g., that a method comprises steps (A) and (B), this does not necessarily mean that step (A) precedes step (B), but it is also possible that step (A) is performed (at least partly) simultaneously with step (B) or that step (B) precedes step (A). Furthermore, when a step (X) is said to precede another step (Z), this does not imply that there is no step between steps (X) and (Z). That is, step (X) preceding step (Z) encompasses the situation that step (X) is performed directly before step (Z), but also the situation that (X) is performed before one or more steps (Y1), . . . , followed by step (Z). Corresponding considerations apply when terms like "after" or "before" are used.

What is claimed is:

1. A system for generating a direct current power output from an alternating current in a primary wire, wherein the system comprises:
    at least one core configured to be located around the primary wire;
    at least one secondary winding arranged around the at least one core, wherein each secondary winding, together with the at least one core and the primary wire, forms a current transformer unit, and wherein each secondary winding has a first end and a second end;
    for each secondary winding, a rectifier, wherein each rectifier is configured to convert an alternating current to a direct current, and wherein each rectifier comprises two AC connections for alternating current and two DC connections for direct current, wherein the first end and the second end of the secondary winding are connected to the AC connections of the rectifier;
    for each secondary winding, a shunting unit arranged and configured to short the ends of the secondary winding, wherein for each secondary winding, the secondary winding and the shunting element are located on a first side of the rectifier, and the load element is located on a second side of the rectifier, the second side being opposite to the first side, the secondary windings are not directly connected to each other on the first side; and
    a load element, wherein the load element is connected to a DC connection of each rectifier.

2. The system according to claim 1, wherein the at least one secondary winding is a plurality of secondary windings.

3. The system according to claim 2, wherein the DC connections of each of the rectifiers that are connected to the load element are connected in parallel.

4. The system according to claim 1, wherein the system is configured to generate at least 30 watts of power.

5. The system according to claim 1, wherein the core is a transformer core configured to induce current in the secondary windings.

6. The system according to claim 1, wherein each rectifier is a rectification bridge.

7. The system according to claim 1, wherein each rectifier and/or each shunting unit comprises a plurality of MOSFETs.

8. The system according to claim 7, wherein each of the plurality of MOSFETs is configured to have a resistance of less than 50 m$\Omega$.

9. The system according to claim 1, wherein the system further comprises a current sensing element for sensing a current that is connected in series to a secondary winding.

10. The system according to claim 9, wherein the current sensing element is located on a first side of the rectifier with the secondary winding and the shunting element, and the load element is located on a second side of the rectifier.

11. The system according to claim 9, wherein the current sensing element is galvanically isolated.

12. The system according to claim 9, wherein the current sensing element has a resistance of less than 5 m$\Omega$.

13. The system according to claim 1, wherein the system further comprises, for each shunting unit, a shunt controller unit for controlling the state of the respective shunting unit.

14. The system according to claim 13, wherein each shunt controller unit comprises at least one optically isolated MOSFET driver.

15. The system according to claim 13, wherein each shunt controller unit comprises a voltage level state input and is configured to control the state of the respective shunt unit in dependence of the voltage level state input, wherein each voltage level state input is based on a voltage across the load element.

16. The system according to claim 13, wherein each shunt controller unit comprises a clock input, and wherein each controller unit is configured to only change a state of the respective shunt unit depending on the clock input and/or a sensed current.

17. The system according to claim 13, wherein each shunt controller unit comprises a D-type flip flop latch.

18. The system according to claim 13, wherein each controller unit is configured to only change the state of the respective shunt current at zero crossing states of an alternating current sensed current, the system further comprises a zero crossing detection element for detecting the zero crossing states of the sensed current.

19. The system according to claim 1, wherein the at least one secondary winding is a plurality of secondary windings, wherein the at least one core is a plurality of cores, the number of the cores equals the number of secondary windings, and each secondary winding is arranged around a distinct core and/or a same core.

* * * * *